United States Patent [19]
Choi

[11] Patent Number: 5,936,889
[45] Date of Patent: Aug. 10, 1999

[54] ARRAY OF NONVOLATILE MEMORY DEVICE AND METHOD FOR FABRICATING THE SAME

[75] Inventor: Woong-Lim Choi, Chungcheongbuk-do, Rep. of Korea

[73] Assignee: LG Semicon Co., Ltd., Cheongju, Rep. of Korea

[21] Appl. No.: 09/031,603

[22] Filed: Feb. 27, 1998

Related U.S. Application Data

[63] Continuation-in-part of application No. 08/890,564, Jul. 9, 1997.

[30]     Foreign Application Priority Data

Jul. 21, 1996 [KR]   Rep. of Korea ...................... 96-28174
Jul. 9, 1997  [KR]   Rep. of Korea ...................... 97-31839

[51] Int. Cl.$^6$ .................................................. G11C 16/06
[52] U.S. Cl. ................................. 365/185.22; 365/185.14
[58] Field of Search ........................ 365/185.22, 185.03, 365/185.24, 185.15, 185.28, 185.14; 257/316, 315, 314

[56]  References Cited

U.S. PATENT DOCUMENTS

| | | | |
|---|---|---|---|
| 5,355,332 | 10/1994 | Endoh et al. | 365/182 |
| 5,386,132 | 1/1995 | Wong | 257/316 |
| 5,471,422 | 11/1995 | Chang et al. | 365/185.26 |
| 5,656,840 | 8/1997 | Yang | 257/316 |
| 5,781,476 | 7/1998 | Seki et al. | 365/185.22 |

*Primary Examiner*—David Nelms
*Assistant Examiner*—Anh Phung
*Attorney, Agent, or Firm*—Fleshner & Kim

[57]  ABSTRACT

An array of a nonvolatile memory device and a fabricating method thereof has a simple stacked-gate structure without metal contact holes. The array of a nonvolatile memory device includes a plurality of memory cells. Each memory cell includes a floating gate, a control gate, and the source/drain regions. A plurality of word lines are connected to the control gates of the memory in a column direction and spaced apart from one another by a predetermined distance in a row direction. A plurality of bit lines are connected to the source/drain regions perpendicular to the word lines. A plurality of program lines is formed in parallel with the bit lines. A plurality of program gates is connected to the program lines for programming the floating gates adjacent to the program gates.

21 Claims, 11 Drawing Sheets

FIG.9A1
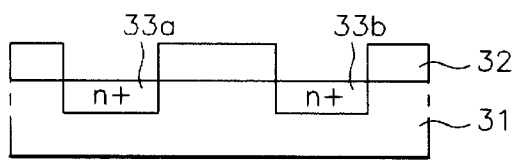
FIG.9A2
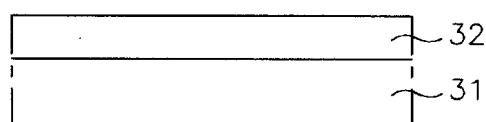
FIG.9B1
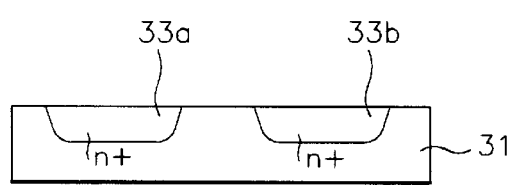
FIG.9B2
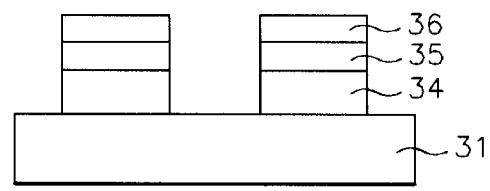
FIG.9C1
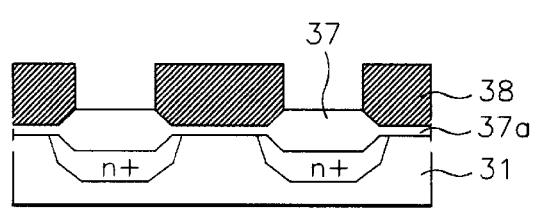
FIG.9C2
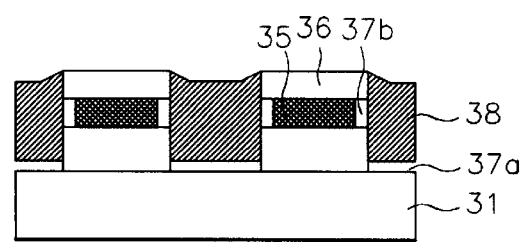
FIG.9D1
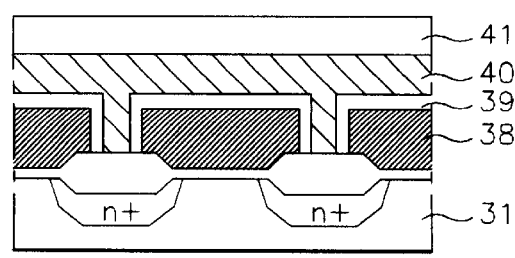
FIG.9D2
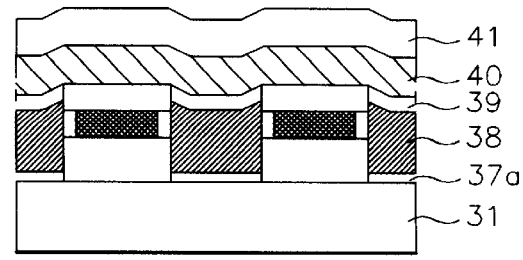

FIG.9E1
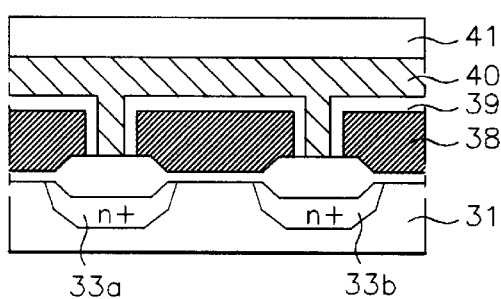
FIG.9E2
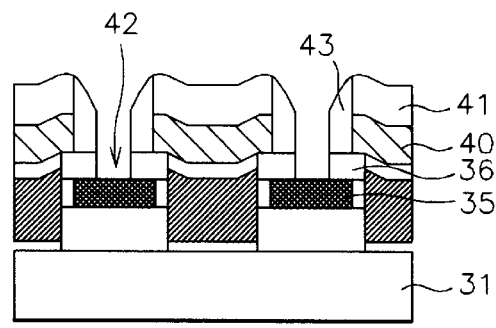
FIG.9F1
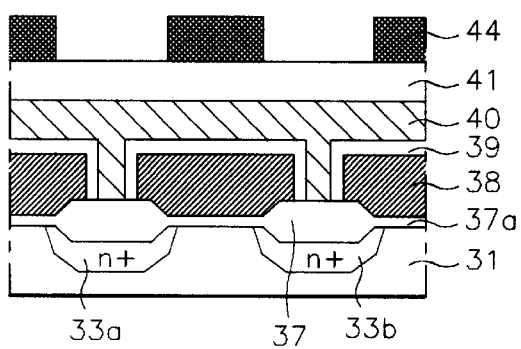
FIG.9F2
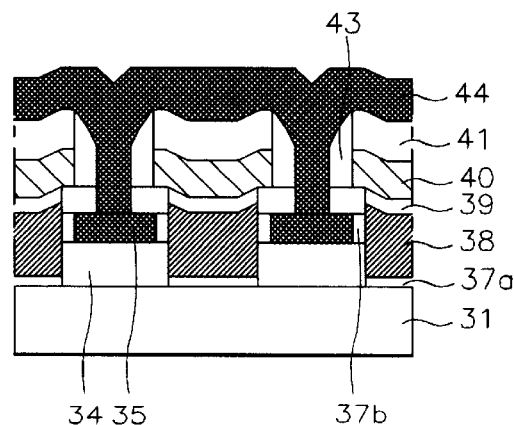

ARRAY OF NONVOLATILE MEMORY DEVICE AND METHOD FOR FABRICATING THE SAME

This is a continuation-in-part application of Ser. No. 08/890,564 filed Jul. 9, 1997.

BACKGROUND OF THE INVENTION

1. Field of the Invention

The present invention relates to a memory device and, more particularly, to a nonvolatile memory device and a method of making thereof.

2. Background of the Related Art

There are two factors that determine an effective size of a memory cell, which determines a packing density of a nonvolatile memory device, such as an electrically erasable programmable read only memory (EEPROM) or a flash EEPROM. One of the two factors is the cell size and the other is the construction of the cell array. A memory cell having a minimum cell construction is a simple stacked-gate structure.

The applications of nonvolatile memory devices, such as EEPROMs and flash EEPROMs, are expanding. However, the cost-per-bit of a memory is expensive, and it is difficult to use nonvolatile semiconductor memories, such as EEPROMS and flash EEPROMS, as mass storage media. Moreover, chips with low power consumption are preferred for portable applications. Accordingly, much development and research has been directed to methods for diminishing the cost-per-bit.

A packing density of a conventional nonvolatile memory device depends on the number of memory cells therein. For multi bit cells, a data of one bit or more is stored in a memory cell, and it is possible to increase the packing density for storing data in an identical area of a chip without decrease of the size of a memory cell. In order to obtain the aforementioned multi bit cell, more than 2 threshold voltage levels should be programmed for each memory cell. For example, to store a data of 2 bits in a cell, each cell should be programmed to have four threshold voltage levels ($2^2$=4). The four threshold voltage levels represent 00, 01, 10, and 11 in a logic state. In such a multi level program, each threshold voltage level has statistical distribution of about 5 V, which is one of the significant problems.

In one of the methods for reducing the voltage distribution, a programming operation is performed by repeating programming and verifying alternately. A series of voltage pulses are applied to cells to program nonvolatile memory cells in desired threshold voltage levels. Then, a reading operation is performed between voltage pulses to verify whether or not the cells have reached the desires threshold voltage levels. During each verification, if a verified threshold voltage level value reaches a threshold voltage level value, the programming operation is halted.

However, it is difficult to reduce the error distribution of the threshold voltage levels by a finite program voltage pulse width in the aforementioned method. Further, since algorithm circuits for repeating programming and verifying alternately are needed, the periphery circuitry area of a chip is increased and a period for programming is lengthened.

FIG. 1A is a cross-sectional view of a general nonvolatile memory device having a simple stacked-gate structure, and FIG. 1B is a circuit equivalent of a general nonvolatile memory cell. A floating gate 3 is formed on a tunneling oxide film 2, which is formed on a p-type semiconductor substrate 1. On the floating gate 3, a dielectric film 4 is formed, upon which a control gate 5 is formed. N-type source drain regions 6a and 6b are formed beneath a surface of a semiconductor substrate 1 at both sides of the floating gas 3.

In such a nonvolatile memory device, an effective cell size is small, and a coupling constant of a control gate 5 is small. The smaller the effective cell size, the lower the coupling constant. Accordingly, in order to prevent the decrease of the coupling constant, a dielectric film 4 made of oxide nitride oxide (ONO) is positioned between the floating gate 3 and the control gate 5. A complex process with an annealing step at a high temperature is required to form the dielectric layer 4 of ONO.

As shown in FIG. 1B, each nonvolatile memory cell includes a floating gate 3, a control gate 5 for adjusting charges provided for the floating gate 3, a floating gate 3, a source 6a, a drain 6b, and a channel region 7 formed between the source and drain 6a and 6b. When a high program voltage is applied to the control gate 5 and the drain 6b, the current flows between the drain 6b and the source 6a. If the current is about the same as the reference current or smaller, a programming completion signal is generated.

FIG. 2A is a circuit diagram of an array of memory cells of a nonvolatile memory device. A plurality of metal bit lines 9 are formed to be spaced apart from one another by a predetermined distance in a column direction. A plurality of word lines 10 are formed at right angle to the metal bit lines 9. A common source line 11 per two word lines 10 is formed in the same direction as the word lines 10.

The drains 6b shown in FIG. 1B are connected to the metal bit lines 9 and the sources 6a are connected to the common source lines 11. Since one metal contact hole 8 per two cells is required, an effective size of memory cells becomes very big. Although an array of a general nonvolatile memory device having a simple stacked-gate structure has a minimum cell size, the actual effective size is limited by the pitch of the metal contact holes 8.

FIG. 2B illustrates an array of memory cells having a split-channel structure with selection gates 12. In this case, because the programming operation is performed by hot electron injection, the problems of program disturb and over-erase can be prevented. A nonvolatile memory device shown in FIG. 2B includes a plurality of word lines 10 formed on a semiconductor substrate (not shown) to be spaced apart from one another by a predetermined distance, a plurality of bit lines 13 formed at right angle to the word lines 10 to form a plurality of square areas, and a plurality of nonvolatile memory cells, each disposed within the square areas.

Each nonvolatile memory cell shown in FIG. 2B includes a floating gate 3 shown in FIG. 4, a control gate 5 for adjusting an amount of charge provided for the floating gate 3 for programming, and an electric field effect transistor for reading or verifying an amount of charge carriers provided for the floating gate 3 during programming. This electric filed effect transistor includes a floating gate 3, a source 6a, a drain 6b, and a channel region formed between the drain and source 6a and 6b.

A control gate 3 of each nonvolatile memory cell is connected to an adjacent word line 10, the source 6a of the nonvolatile memory cell is commonly connected to the bit line 13 adjacent to the drain of a nonvolatile memory cell. The selection transistors 12 are connected to the bit line 13, and a metal contact hole 8 per 32 nonvolatile memory cells or more is connected to the selection transistor 12 in a column direction. Hence, an effective cell size can be reduced.

However, a size of a unit cell increases because of the selection transistors. Furthermore, a program operation by tunneling, which is an operation with low power consumption, is not possible, because two cells adjacent in a direction of word lines 10 are under the same bias condition.

FIG. 2C illustrates an alternative to FIG. 2A of an array of memory cells having a simple stacked-gate structure. A plurality of metal bit lines 9 are formed, spaced apart from one another by a predetermined distance in a column direction and each bit line is completely divided into a source line 15 and a drain line 14 in the same direction as the metal bit lines 9.

The source 6a shown in FIG. 1B is connected to the source line 15 and the drain 6b of a nonvolatile memory cell is connected to the drain line 14. One metal contact hole 8 is connected to each metal bit line 9, and the control gates 5 are connected to a plurality of word lines 10. However, in this arrangement, the size of a unit cell increases because of the division of bit lines.

FIG. 3 is a cross-sectional view showing a structure of a nonvolatile memory device having split channel cells. As shown in FIG. 3, a floating gate 3 is formed on the oxide layer 2 formed on a p-type semiconductor substrate 1. A control gate 5 is formed over the floating gate 3. An insulating layer 16 is formed on the entire surface and a selection gate 17 is formed on the entire surface including the control gate 5 and the floating gate 3. A dielectric film 4 is formed between the control gate 5 and the floating gate 3. A source 6a is formed beneath the surface of the semiconductor substrate 1 to be set off from the floating gate 3, and a drain 6b is formed beneath the surface of the semiconductor substrate 1 at the other side of the floating gate 3.

FIG. 4A is a cross-sectional view of a nonvolatile memory device having split channel cells and FIG. 4B is a cross-sectional view of the nonvolatile memory device in a direction of channel width shown in FIG. 4A.

As shown in FIG. 4A, floating gates 3 are formed over a p-type semiconductor substrate 1, spaced apart from one another by a predetermined distance and a control gate 5 is formed over the floating gate 3. A tunneling oxide layer 2 is formed between the floating gate 3 and the semiconductor substrate 1, and a dielectric film 4 is formed between the floating gate 3 and the control gate 5. A source 6a is formed beneath the surface of the semiconductor substrate 1 to be offset from the floating gate 3 and a drain 6b is formed beneath the surface of the semiconductor substrate 1 at the other side of the floating gate 3.

As shown in FIG. 4B, the field oxide layers 18, spaced apart from one another by a predetermined distance, are formed on the surface of the semiconductor substrate 1 for insulating one cell from another. Gate insulating layers 19 are formed on the semiconductor substrate 1 between the field oxide layers 18. Floating gates 3 are formed to partially overlap the field oxide layers 18. The dielectric film 4 is formed on a predetermined area of the floating gate 3, and the control gates 5 are formed on the dielectric film 4. Cap insulating layers 20 are formed on the control gate 5 and sidewall spacers 21 are formed on both sides of the cap insulating layers 20 and the control gate 5, erases gates 17 are formed on the cap insulating layers 20 and on the field oxide layer 18. The tunneling oxide layers 22 are formed at interface of the floating gate 3 and the erase gate 17.

However, related nonvolatile memory devices have various problems. For example, though the array having a simple stacked-gate structure of FIG. 2C provides a minimum effective cell size, a program disturb is still generated.

The above references are incorporated by reference herein where appropriate for appropriate teachings of additional or alternative details, features and/or technical background.

SUMMARY OF THE INVENTION

An object of the present invention is to substantially obviate one or more of problems due to limitations and disadvantages of the related art.

An object of the invention is to diminish a cell size and simplify its process.

To achieve these and other advantages and in accordance with the purpose of the present invention, as embodied and broadly described, the array of a nonvolatile memory device includes a plurality of EEPROM cells having floating gates, control gates, and source/drain regions, a plurality of word lines connected to the control gates in a direction of column and spaced apart from one another by a predetermined distance in a direction of row; a plurality of bit lines connected to the source/drain regions at right angle to the word lines; a plurality of program lines formed in parallel with the bit lines, wherein there is formed one program line per a bit line; and a plurality of program gates connected to the program lines for programming the floating gate adjacent to each of the program gates.

in another aspect of the present invention, a method for fabricating a nonvolatile memory device having array includes the steps of forming bit lines of second conductivity type formed in a direction beneath a surface of a semiconductor substrate of first conductivity type and spaced apart from one another by a predetermined distance; depositing a field insulating layer, a first conductive layer, and a buffer insulating layer on the entire surface; forming at right angle to the bit lines a plurality of first lines of the field insulating layer, the first conductive layer for program gates, and the buffer insulating layer stacked, the first lines being spaced apart from one another by a predetermined distance; forming a gate insulating layer on the exposed semiconductor substrate and tunneling oxide layer on side of the first conductive layer in the first line; forming between the first lines a plurality of second lines of conductivity for floating gates; selectively removing the first conductive layer, the buffer insulating layer, and the second lines of conductivity to form a plurality of program gates and a plurality of floating gates between the bit lines; forming a dielectric film on the entire surface of the semiconductor substrate including the floating gates; depositing a third conductive layer and a cap insulating layer on the dielectric film and then selectively removing the third conductive layer and the insulating layer to form a plurality of word lines covering the floating gates at right angle to the bit lines; forming insulating sidewall spacers on both sides of each word line; and forming contact holes on the program gates and forming in parallel with the bit lines a plurality of program lines connected to the program gates through the contact holes.

The present invention can be also achieved in parts or in whole by a memory device, comprising an array of memory cells; and a plurality of bit lines, word lines and program lines, each bit line, word line and program line being coupled to a corresponding memory cell, wherein each memory cell includes source and drain regions formed in a substrate and the bit lines being formed in the substrate coupled to the source and drain regions, an isolation layer formed on the source and drain regions; a gate insulating layer formed between the source and drain regions and between the isolation layers, a gate formed on the gate insulating layer, a program gate insulatively formed adjacent to the gate and coupled to a corresponding program line, and a control gate insulatively formed on the floating gate.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIGS. 9A1–9A2 to 9F1–9F2 are cross-sectional views showing the process steps of a method for fabricating a nonvolatile memory device in accordance with a preferred embodiment of the present invention.

DETAILED DESCRIPTION OF THE PREFERRED EMBODIMENTS

Figure 5A:
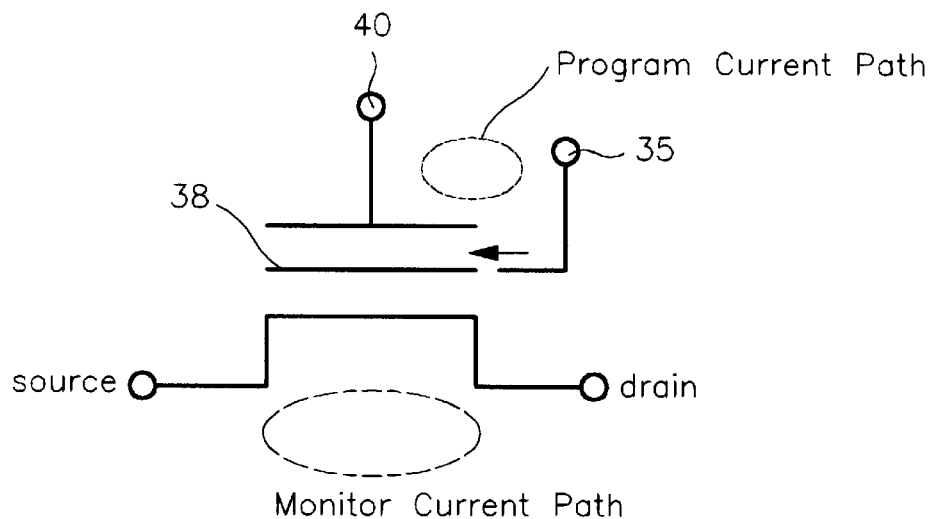
FIG. 5A is a circuit diagram of a nonvolatile memory cell in accordance with a preferred embodiment of the present invention.
Figure 5B:
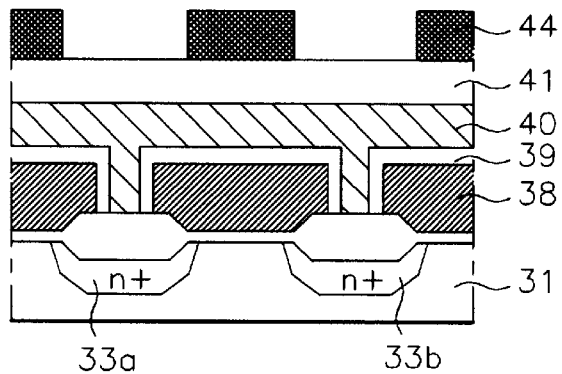
FIG. 5B is a cross-sectional view of a nonvolatile memory device shown in a direction of channel in accordance with a preferred embodiment of the present invention.
Figure 5C:
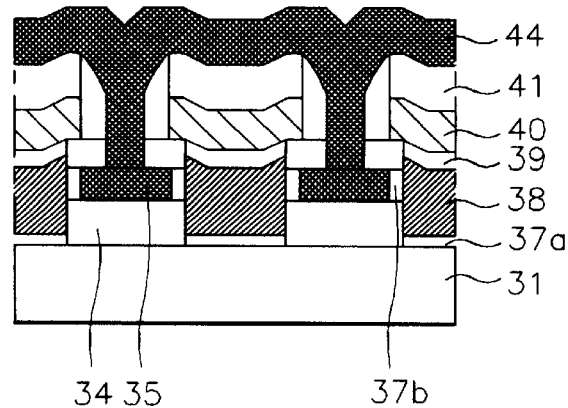
FIG. 5C is a cross-sectional view of a nonvolatile memory device in a direction of channel width in accordance with the preferred embodiment of the present invention.

FIG. 5A is a circuit diagram of a nonvolatile memory cell, FIG. 5B is a cross-sectional view of a nonvolatile memory device shown in a channel direction, and FIG. 5C is a cross-sectional view of a nonvolatile memory device shown in a direction of channel width.

As shown in FIG. 5A, a nonvolatile memory device cell includes a floating gate 38, a program gate 35 for providing charges to the floating get 38 during programming, a control gate 40 for adjusting an amount of charge provided to the floating gate 38, a program current path for reading or verifying an amount of charge carrier provided for the floating gate 38 during programming, and a monitor current path for monitoring current path between the source and drain. In a nonvolatile memory device of the present invention, the program gate 35 is added to an electric field transistor composed of the floating gate 38, the word line (control gate) 40, source and drain, and a channel region formed between the source and drain.

Figure 6A:
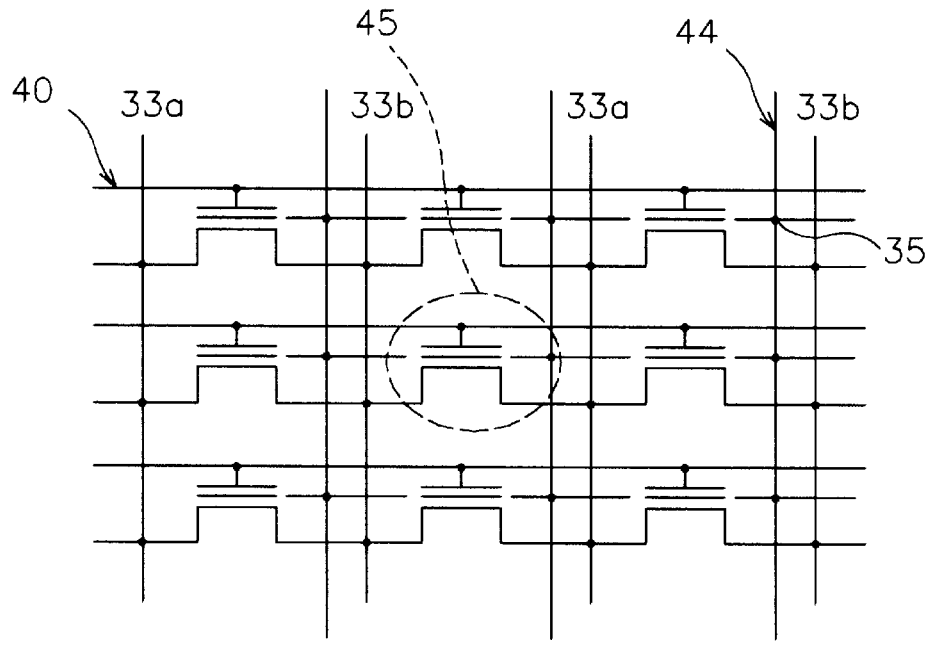
FIG. 6A is a circuit diagram of a first array of a nonvolatile memory device in accordance with the preferred embodiment of the present invention.
Figure 6B:
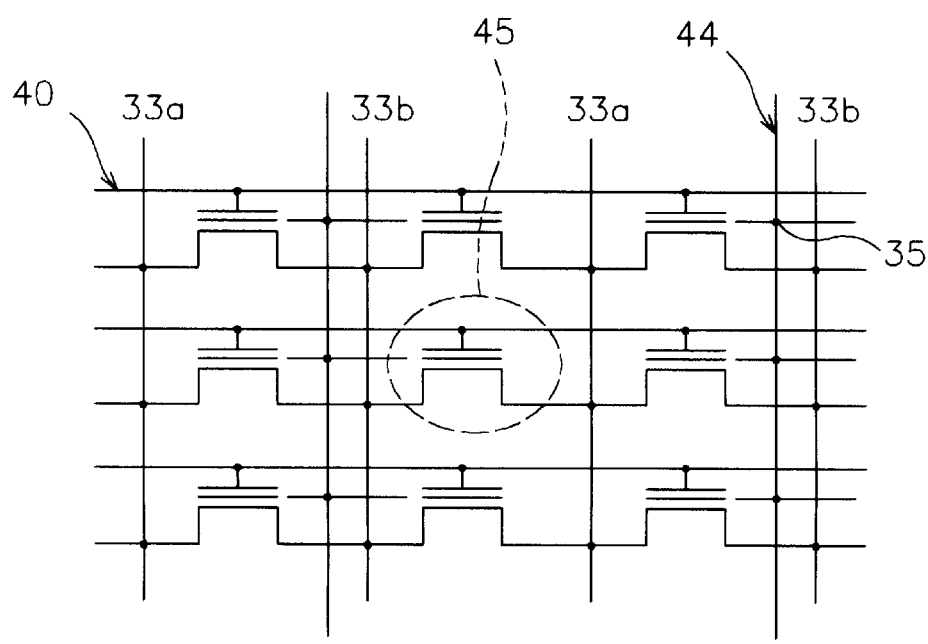
FIG. 6B is a circuit diagram of a second array of a nonvolatile memory device in accordance with the preferred embodiment of the present invention.

Referring to FIGS. 6A and 6B, the program lines 44 are added to connect the program gates 35 of the memory cells. There are a plurality of EEPROM cells, each having the floating gate 38, the control gate 40, and the source/drain regions. A plurality of word lines 40, connected to a plurality of control gates in a column direction, are spaced apart from one another by a predetermined distance in a row direction. A plurality of bit lines 33a and 33b are connected the source and drain regions at right angle to the word lines, spaced apart from one another by a predetermined distance in a column direction. A plurality of program lines 44 are formed in parallel with the bit lines 33a and 33b.

In this case, one program line 44 is needed per one bit line 33a or 33b, as shown in FIG. 6A. A plurality of program gates 35 are connected to the program lines 44 for programming adjacent floating gates 38. Each of a plurality of nonvolatile memory cell regions 45 is disposed per a word line 40, a bit line 33a or 33b, and a program gate 35. At this time, a program gate 35 per a cell is formed in a matrix form. Alternatively, a program gate 35 per two cells is formed between the floating gates 38, as shown in FIG. 6B.

Figure 7:
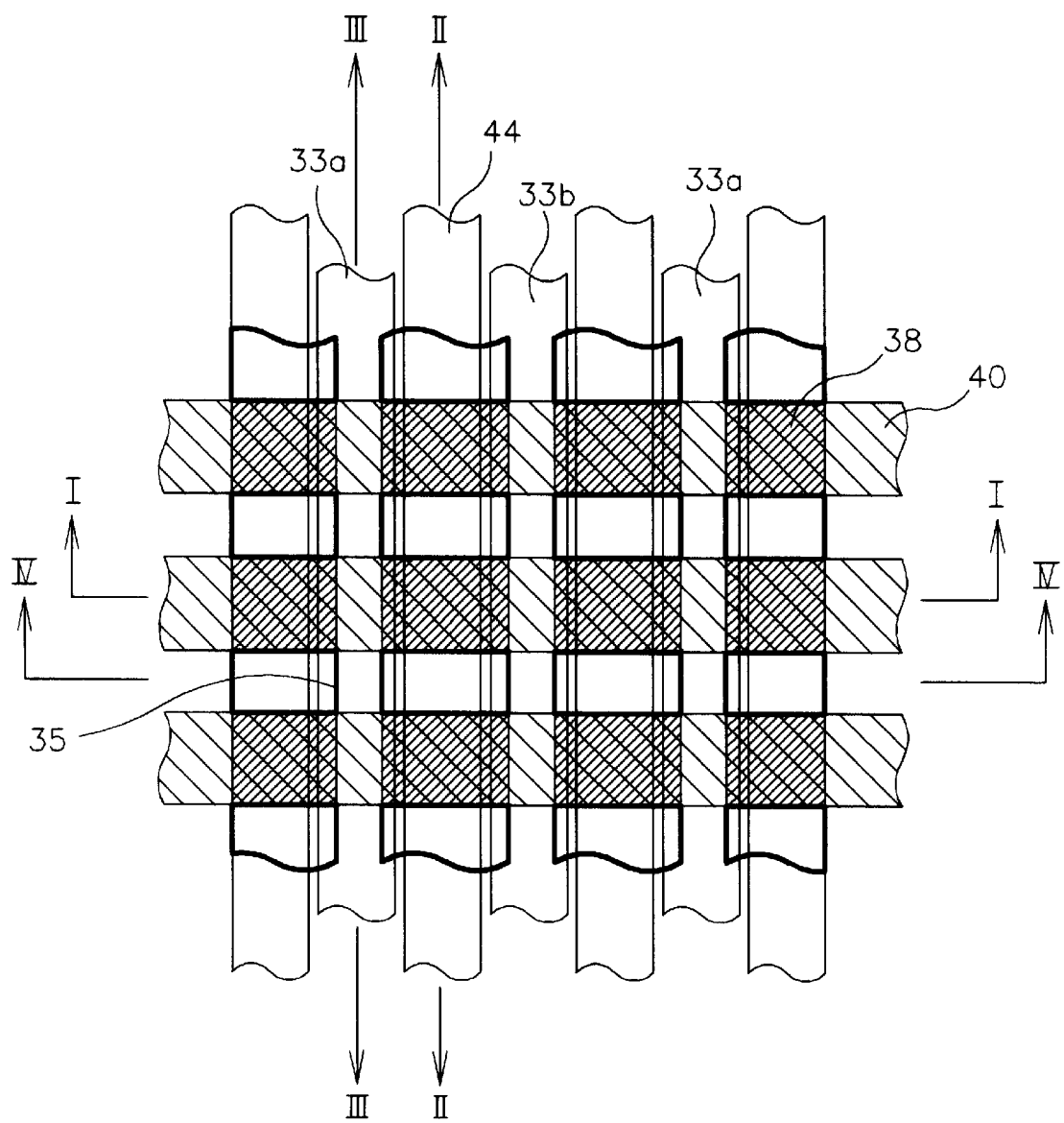
FIG. 7 is a layout of an array of a nonvolatile memory device in accordance with the preferred embodiment present invention.
Figure 8A:
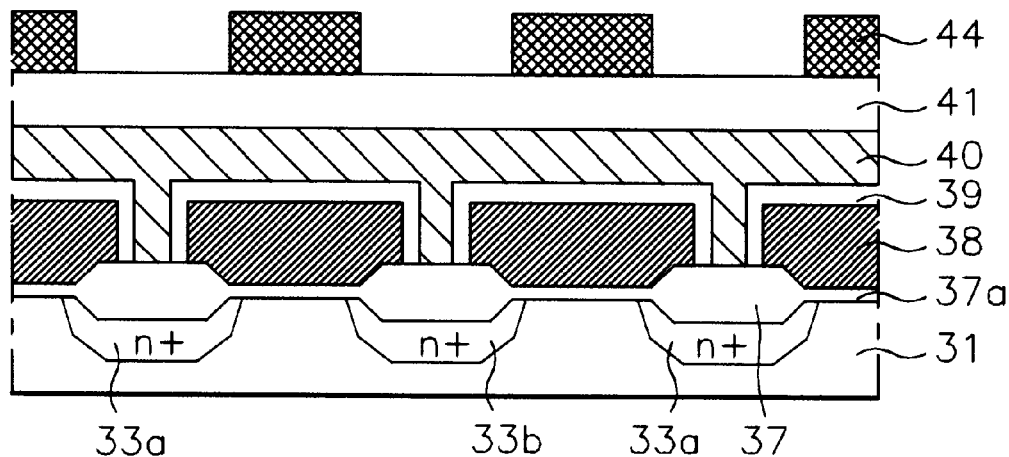
FIG. 8A is a cross-sectional view of the nonvolatile memory device, taken along line I—I of FIG. 7.
Figure 8B:
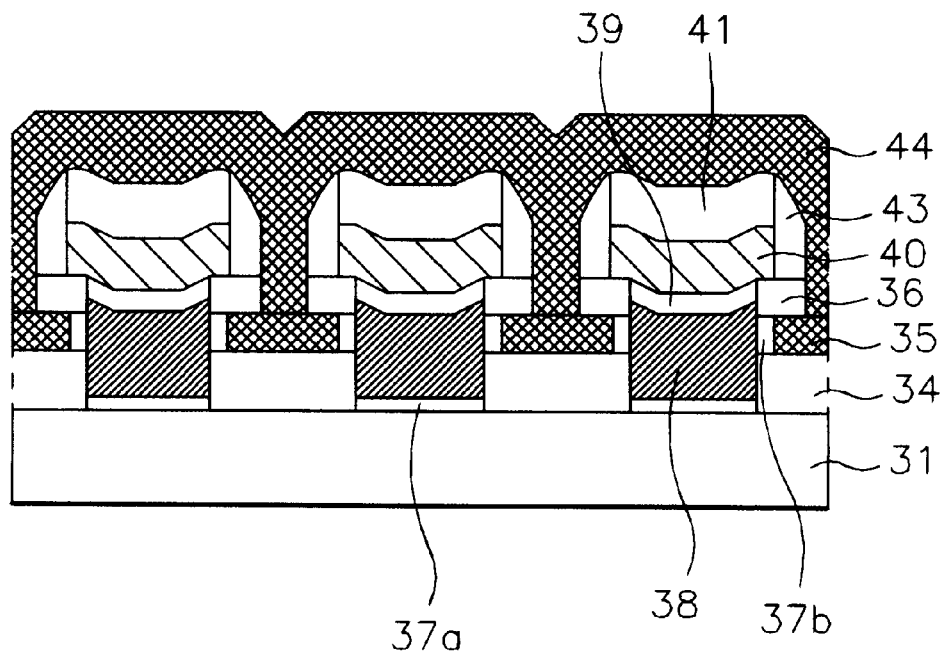
FIG. 8B is a cross-sectional view of the nonvolatile memory device, taken along line II—II of FIG. 7.
Figure 8C:
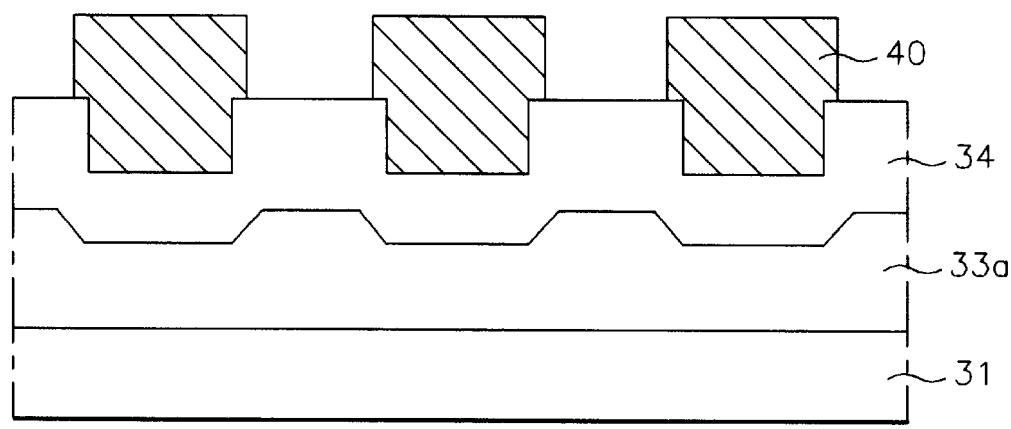
FIG. 8C is a cross-sectional view of the nonvolatile memory device, taken along line III—III of FIG. 7.
Figure 8D:
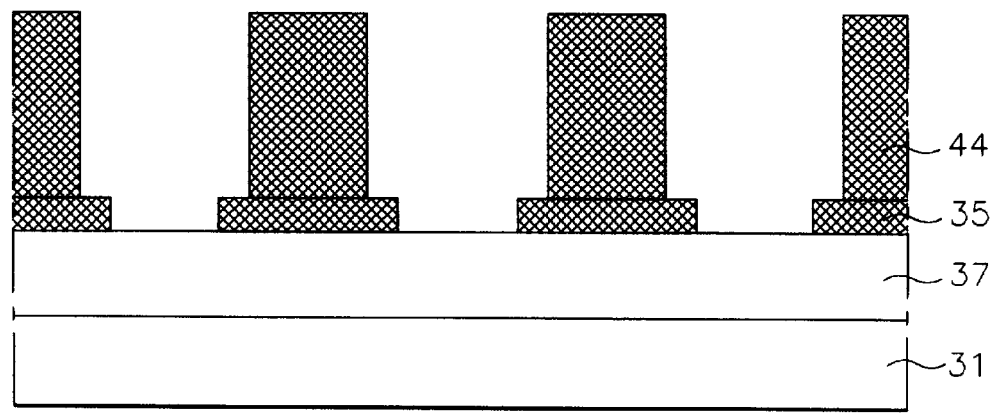
FIG. 8D is a cross-sectional view of the nonvolatile memory device, taken along line IV—IV of FIG. 7.

FIG. 7 is a layout of a nonvolatile memory device in accordance with the present invention. FIG. 8A is a cross-sectional view of the nonvolatile memory device, taken along line I—I of FIG. 7, and FIG. 8B is a cross-sectional view of the nonvolatile memory device, taken along line II—II of FIG. 7. FIG. 8C is a cross-sectional view of the nonvolatile memory device, taken along line III—III of FIG. 7, and FIG. 8D is a cross-sectional view of the nonvolatile memory device, taken along line IV—IV of FIG. 7.

As shown in FIG. 7, a word line 40 is connected to a control gate. The bit lines 33a and 33b are buried in a semiconductor substrate 31, spaced apart from one another by a predetermined distance at right angle to the word line 40, wherein the conductivity type of the bit lines 33a and 33b is opposite to that of the semiconductor substrate 31. The program lines 44 are formed perpendicular with the word lines 40 and the program gates 35 are formed in a matrix form between the word lines 40 and cell regions.

As shown in FIGS. 5A and 8A, there are no contact holes in the array. Thus, the source and drain are not sectionalized and diffusing bit line 33a and 33b function as a source and a drain of each cell are formed in a row direction, spaced apart from one another by a predetermined distance. An isolation oxide layer 37 is formed on the bit lines 33a and 33b along the bit lines 33a and 33b. A gate oxide layer 37 is formed on the bit lines 33a and 33b between the isolation oxide layers 37. The floating gates 38 are formed on the gate oxide layers 37a between the isolation oxide layer 37, as shown in FIGS. 5B and 8A. A dielectric film 39 is formed to cover the floating gates 38. The word lines (control gates) 40 are formed in a perpendicular direction over the floating gate 38 and the over the isolation oxide layer 37. An insulating layer 41 is formed on the word line 40, and program lines 44 is formed on the insulating layer 41 over the floating gate 38, spaced apart form one another by a predetermined distance.

Referring to FIGS. 5B and 8B, the program lines 44 are formed in parallel with bit lines 33a and 33b (see FIGS. 7 and 8A). Gate oxide layers 37a are formed on the semiconductor substrate 31, spaced apart from one another by a predetermined distance. The floating gates 38 are formed on the gate oxide layers 37a and field oxide layers 34, program gates 35, buffer oxide layers 36 are formed on both sides of floating gates 38. The tunneling oxide layers 37b are formed on both sides of each program gate 35 formed between the field oxide layer 34 and the buffer oxide layer 36. The predetermined area of the buffer oxide layer 36 is etched to form the contact holes. A dielectric film 39, a word line (control gate) 40, and an insulating layer 41 are formed on the floating gates 38. The insulating sidewall spacers 43 are formed on both sides of the insulating layer 41 and the word line (control gate) 40. A program line 44 is formed to connect the program gates 35 through the contact holes.

As shown in FIG. 8C, a buried diffusion bit line 33a is formed in a prescribed direction on the semiconductor substrate 30. The isolation oxide layers 37 and field oxide layers 34 are formed alternatively on the bit lines 33a. The field oxide layer 34 is thicker than the isolation oxide layer 37. Word lines 40 are formed alternatively on the isolation oxide layer 37.

Referring to FIG. 8D, the buried diffusion bit lines 33a and 33b are formed in the semiconductor substrate 31, spaced apart from one another by a predetermined distance. An isolation oxide layer 37 is formed on the bit lines 33a and 33b. A field oxide layer 34 is formed on the entire surface. Program gates 35 are formed on the field oxide layer 34, spaced apart from one another by a predetermined distance. Program lines 44 are formed in contact with predetermined areas of the program gates 35.

Figure 1A:
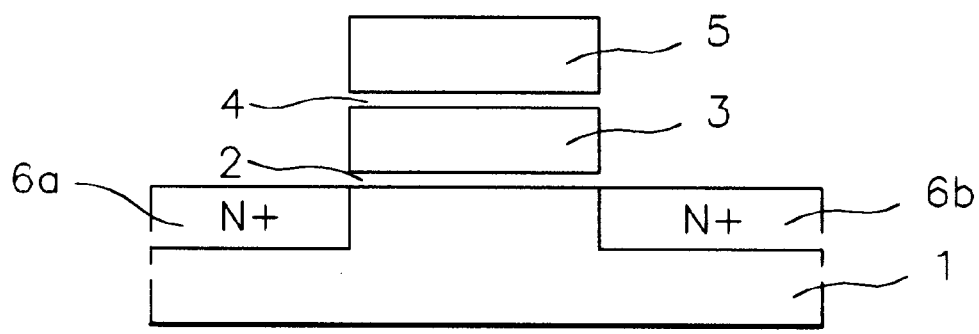
FIG. 1A is a cross-sectional view of a general nonvolatile memory device having a simple stacked-gate structure.
Figure 1B:
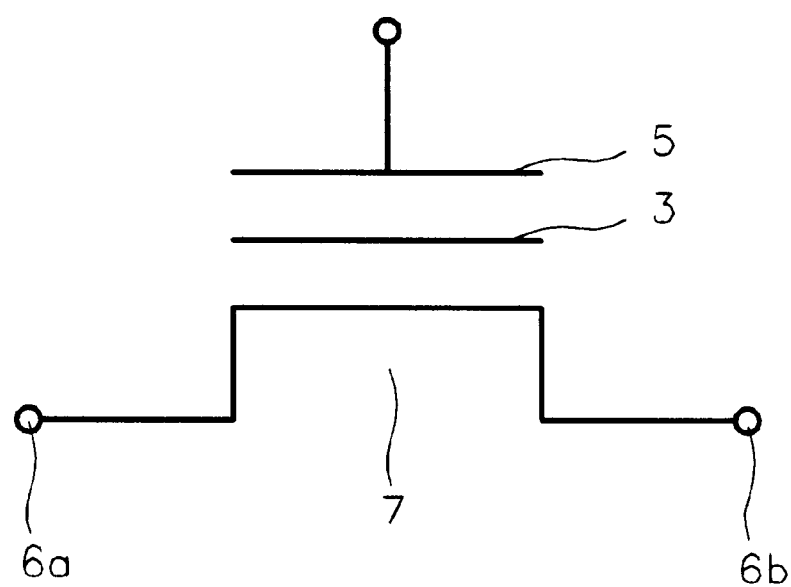
FIG. 1B is a circuit equivalent of a general nonvolatile memory cell.
Figure 2A:
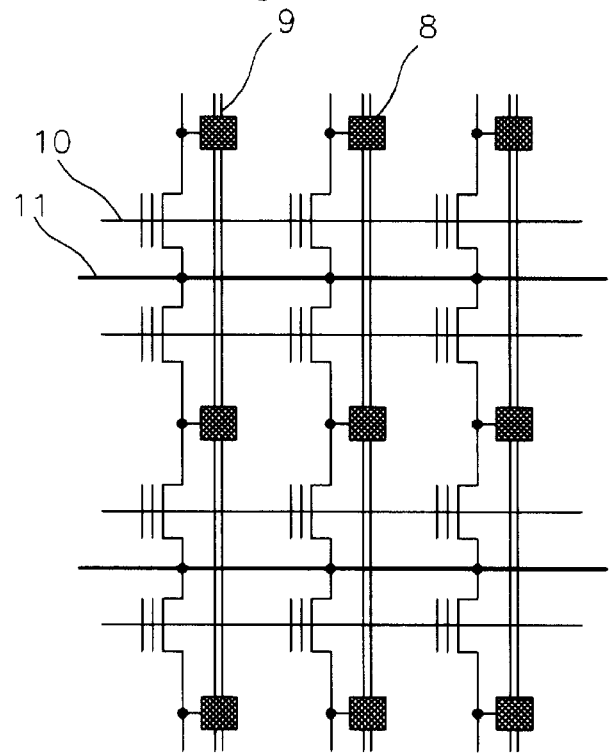
FIG. 2A is a circuit digram of a related nonvolatile memory device.
Figure 2B:
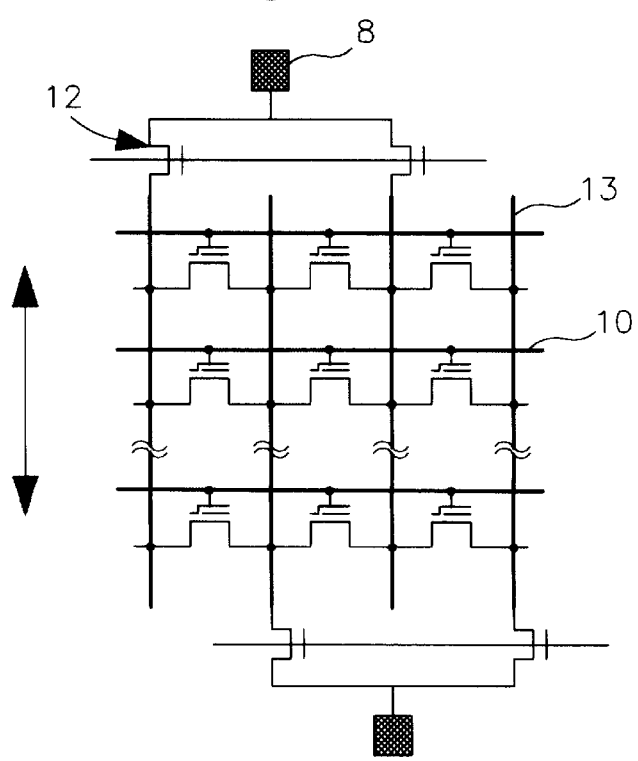
FIG. 2B is a circuit diagram of a related nonvolatile memory device having a simple stacked-gate structure.
Figure 2C:
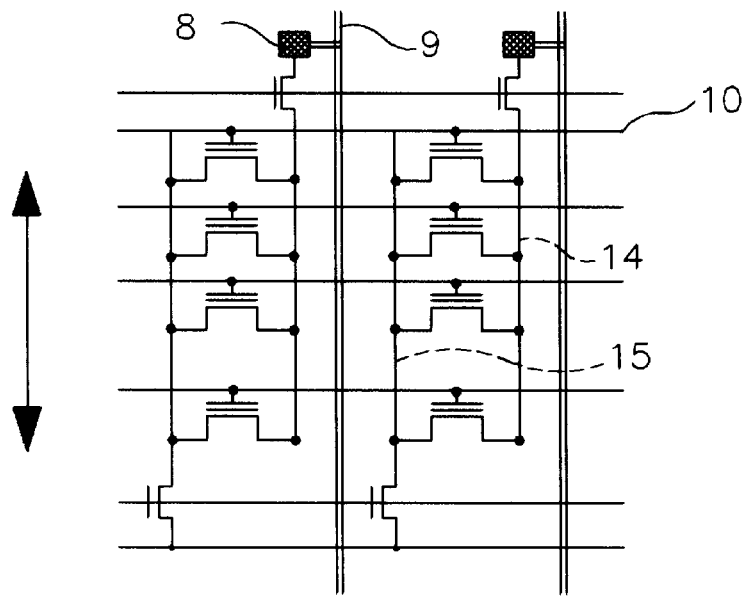
FIG. 2C is a circuit diagram of a related nonvolatile memory device with source and drain separated form each other.
Figure 3:
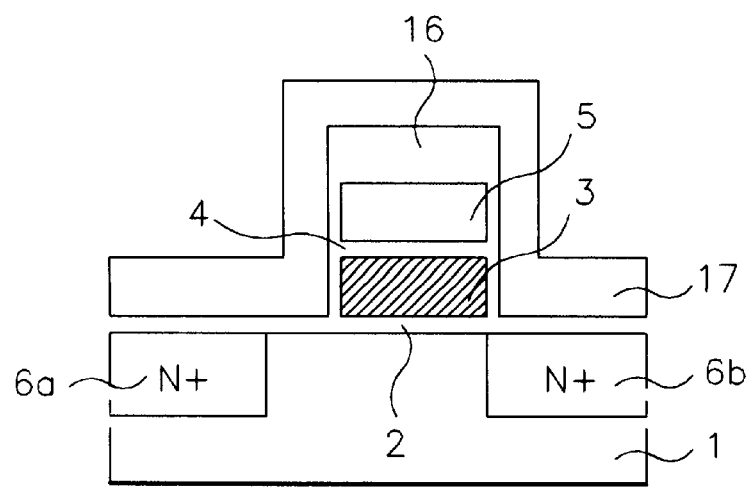
FIG. 3 is a cross-sectional view showing a structure of a related nonvolatile memory device a split-channel type having divided gates.
Figure 4A:
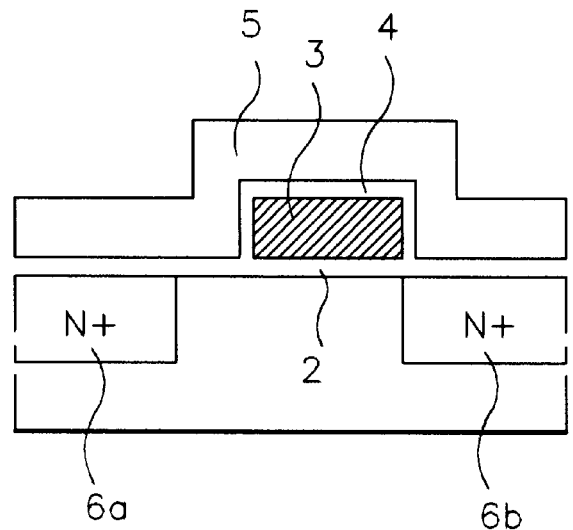
FIG 4A is a cross-sectional view showing a structure of a related nonvolatile memory device of a split-channel type.
Figure 4B:
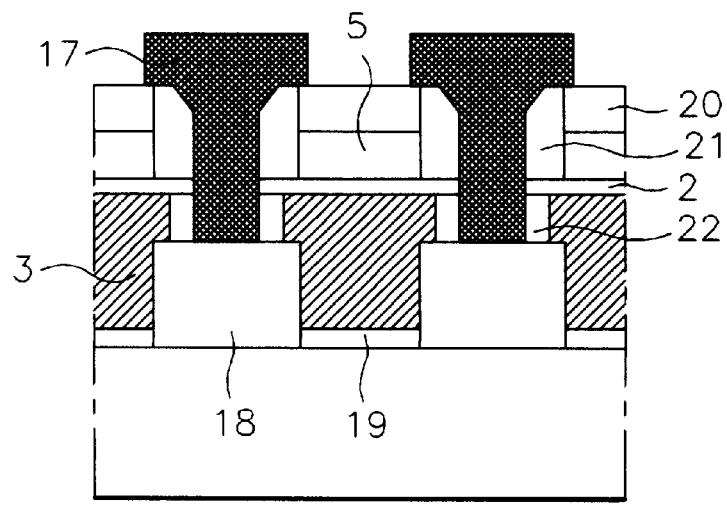
FIG. 4B is a cross-sectional view showing a structure of a related nonvolatile memory device shown in a direction of channel width of FIG. 4A.

FIGS. 9A1–9A2 to 9F1–9F2 are cross-sectional views showing process steps of a nonvolatile memory device in accordance with a preferred embodiment of the present invention. FIGS. 9A1–9F1 are cross-sections taken along line I—I of a word line 40 and FIGS. 9A2–9F2 are ones taken along line II—II of a program line 44. According to the present invention, since program gates are formed before the formation of the floating gates, the program gates are placed under the floating gates. Thus, programming is performed through the lateral sides of the program gates.

Referring initially to FIGS. 9A1 and 9A2, a photo resist film 32 is coated on a p-type semiconductor substrate 31 and selectively patterned with an exposure and development process to expose the semiconductor substrate 31. With the photo resist pattern 32 serving as a mask, n-type heavily doped impurity ions are implanted into the exposed semiconductor substrate 31 to form a plurality of bit lines 33a and 33b. The bit lines 33a and 33b are diffused in the semiconductor substrate 31 such that they are buried in the substrate. Alternatively, high temperature low pressure deposition (HLD) spacers are formed to prevent the lateral diffusion of the n$^+$ diffusion bit lines 33a and 33b functioning as a source and a drain. Then, n-type ions are implanted and diffused to form bit lines 33a and 33b.

Referring to FIG. 9B1, the remaining photo resist film 32 is removed. Thereafter, a first oxide layer, a first polysilicon layer, and a second oxide layer are successively formed and then a photo resist film is coated. An etch process is performed to anisotropically etch the first oxide layer, the first polysilicon layer, and the second oxide layer, thereby forming field oxide layers 34, program gates 35, and buffer oxide layers 36 between the bit lines 33a and 33b, ash shown in FIG. 9B2.

The field oxide layers 34, the program gates 35, and the buffer oxide layers 36 are at right angle to the bit lines 33a and 33b. The etched field oxide layer 34, the program gate 35, and the buffer oxide layer 36 constitute a first line. The areas except the field oxide layer 34 and the n$^+$ bit lines 33a and 33b are used as the channel regions.

Referring to FIG. 9C1, a thermal oxidation process is performed over the entire surface to form the gate oxide layers 37a. If the thermal oxidation process is performed, thicker isolation layers 37 are formed on the bit lines 33a and 33b due to the heavy doping of the bit lines 33a and 33b. The oxidation oxide layer 37 can be used as an etch-preventing film in a following process of etching a second polysilicon layer.

When the thermal oxidation process is performed to form gate layers 37a, the sides of the program gate 35, between the second field oxide layer 34 and the buffer oxide layer 36, are oxidized thereby forming the tunneling oxide layers 37b on both sides of the program gate 35. Next, a second polysilicon layer is deposited to fill the active regions between the isolation oxide layer 37 and the field oxide layer 34 and then etched-back to remove the second polysilicon layer on the field oxide layer 34, the program gate 35, and the buffer oxide layer 36. As a result, second conductivity lines of the floating gates 38 are formed between the first lines.

Referring to FIGS. 9D1 and 9D2, using a mask in parallel with the bit lines between the bit lines 33a and 33b, the second lines having the buffer oxide layer 36, the first polysilicon layer, and the second polysilicon layer over the bit lines 33a and 33b are anisotropically etched to form the program gates 35 and floating gates 38 in a matrix form. Thereafter, a dielectric film 39 is formed on the semiconductor substrate 31 to cover the floating gates 38. At this time, the dielectric film 39 can be made of oxide or oxide/nitride/oxide (ONO). A third polysilicon layer and an insulating layer 41 are deposited on the entire surface.

Referring to FIGS. 9E1 and 9E2, the third polysilicon layer and the insulating layer 41 are anisotropically etched to cover the active regions between the isolation oxide layers 37 and the field oxide layers 34 and at right angle to the bit lines 33a and 33b, thereby forming the word lines (control gate) 40. Subsequently, an oxider layer is deposited on the word lines 40 and the insulating layer 41 and then an anisotopical etch process is performed to form the sidewall spacers 43 on both sides of the insulating layer and the word line 40. Simultaneously, the buffer oxide layers 36 on the program gates 35 are etched to form the contact holes 42 on the program gates 35.

Referring to FIGS. 9F1 to 9F2, a metal layer or polysilicon layer is deposited on the entire surface and contacts the program gate 35 formed on the field oxide layer 34. The polysilicon layer or the metal layer is anisotropically etched in parallel with the bit lines 33a and 33b to form the program lines 44, wherein one polysilicon layer is needed per a bit line 33a or 33b. Alternatively, if one program gate 35 is needed per two cells, the program line 44 if formed on every other program gate 35 on the field insulating layer 34.

The operation of a nonvolatile memory device having the aforementioned structure will be described, with an operation of programming and monitoring performed simultaneously. A cell selected among the cell regions 45 should be satisfied with operation for selection during monitoring and programming. In other words, since the monitoring operation is good as the reading operation, there should be selection for the reading and programming operations. Voltages are applied to a word line 40 and a bit line 33a or 33b, which are at a right angle to the word line 40. For example, a positive voltage of 8 V and 1 V are applied to the word line and the bit line 33a or 33b for the sensing operation. A ground voltage is applied to the bit line 33a or 33b at the other side of the selected cell (see FIG. 5A).

Through the foregoing selection for programming, bias voltages are applied to the word lines 40 and the program lines 44 at right angle to the word lines 40 through the tunneling oxide layer 37b of the program gates, thereby causing tunneling. At this time, if the cell is an n-channel, a positive voltage of +8 V and a negative voltage of −8 should be applied to the word line 40 and the program line 44, respectively, to inject electrons from the program gates 35 to the floating gates 38. Suitable voltages are applied to the deselected word line 40 and the program line 44 to prevent the disturbance of the deselected cells.

An erasing operation can be carried out through the gate oxide layer 37a to a semiconductor substrate 31 or to program gates 35. In case it is carried to the semiconductor substrate 31, the gate oxide layer 37a should have a thickness of 10 nm for good tunneling of the gate oxide layers 37a. Also, as for the bias voltage, a negative voltage of −8 V or a ground voltage of 0 V is applied to a word line (control gate) 40 and a positive voltage is applied to the bit line 33a or 33b used as drain. Otherwise, a negative voltage of −8 V or a ground voltage of 0 is applied to the word line (control gate) 40 and a positive voltage is applied to the semiconductor substrate 31.

When the erasing operation is carried through a program gate 35, both the programing and erasing operations are all carried out through the program gates 35. Thus, the reliability of the tunneling oxide layers 37b should be carefully considered.

A nonvolatile memory device and a fabricating method thereof have various advantages. Since no metal contact holes are needed, a nonvolatile memory device with a minimum effective size can be obtained, thereby increasing the packing density of cells. Since the floating gates are formed with an etch-back process, the number of masks are reduced to simplify the overall process. Since a program line per a program gate is formed, the program coupling between the program gates and floating gates can be reduced. Further, the bit lines are buried in the semiconductor substrate, they can be used as source and drain regions of a cell. The tunneling oxide layers for the programming operation are formed simultaneously when a thermal oxidation process is performed to form gate oxide layers, thereby reducing the fabricating process steps.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A nonvolatile memory device comprising:
   a plurality of memory cells having floating gates, control gates, and source/drain regions;
   a plurality of word lines connected to the control gates and spaced apart from one another by a predetermined distance;
   a plurality of bit lines connected to the source/drain regions in a direction different from the word lines;
   a plurality of program lines each formed per a bit line in parallel with the bit lines; and
   a plurality of program gates connected to the program lines for programming the floating gates adjacent to each of the program gates.

2. A nonvolatile memory device comprising:
   a plurality of memory cells having floating gates, control gates, and source/drain regions;
   a plurality of word lines connected to the control gates in a first direction and spaced apart from one another by a predetermined distance;
   a plurality of bit lines connected to the source/drain regions in a direction different from the word lines;
   a plurality of program lines, each formed per a pair of adjacent two cells between the pair of the adjacent cells and in parallel with the bit lines; and
   program gates each per a pair of cells formed between the floating gates.

3. A method for fabricating a nonvolatile memory device comprising the steps of:
   forming bit lines of a second conductivity type formed in a direction beneath a surface of a semiconductor substrate of first conductivity type and spaced apart from one another by a predetermined distance;
   depositing a field insulating layer, a first conductive layer, and a buffer insulating layer on the entire surface;
   forming at right angle to the bit lines a plurality of first lines of the field insulating layer, the first conductive layer for program gates, and the buffer insulating layer stacked, the first lines being spaced apart from one another by a predetermined distance;
   forming a gate insulating layer on the exposed semiconductor substrate and tunneling oxide layers on side of the first conductive layer in the first line;
   forming between the first lines a plurality of second conductive lines for floating gates;
   selectively removing the first conductive layer, the buffer insulating layer, and the second lines of conductivity to form a plurality of program gates and a plurality of floating gates between the bit lines;
   forming a dielectric film on the entire surface of the semiconductor substrate including the floating gates;
   depositing a third conductive layer and a cap insulating layer on the dielectric film and then selectively removing the third conductive layer and the cap insulating layer to form a plurality of word lines covering the floating gates at right angle to the bit lines;
   forming insulating sidewall spacers on both sides of each word line; and
   forming contact holes on the program gates and forming in parallel with the bit lines a plurality of program lines connected to the program gates through the contact holes.

4. The method of claim 3, wherein the bit lines are buried in the semiconductor substrate by implanting impurity of second conductivity type into the semiconductor substrate and diffusing the impurity ions.

5. The method of claim 3, wherein the gate oxide layer and the isolation oxide layer and the tunneling oxide layer are formed simultaneously by a thermal oxidation process.

6. The method of claim 3, wherein the dielectric film is made of oxide or oxide/nitride/oxide (ONO).

7. The method of claim 3, wherein the program gates, the floating gates, and the control gates are made of polysilicon.

8. The method of claim 3, wherein the gate oxide layer on the bit lines is thicker than the gate oxide layer formed under the floating gate.

9. The method of claim 3, wherein the second conductive layer is deposited on the entire surface to fill spaces between the first lines, and then etched-back to remain between the first lines, so as to form the second lines of conductivity.

10. The method of claim 3, wherein there is formed each of the program gates per two floating gates, i.e. per two cell.

11. The method of claim 3, wherein there is formed each of the program lines for a pair of adjacent cells.

12. A memory device, comprising:

an array of memory cells; and a plurality of bit lines, word lines and program lines, each bit line, word line and program line being coupled to a corresponding memory cell, said plurality of bit lines formed in a direction different from said plurality of wordlines and said plurality of bit lines being formed in parallel with said plurality of program lines, wherein each memory cell includes source and drain regions formed in a substrate and said bit lines being formed in the substrate coupled to said source and drain regions, an isolation layer formed on said source and drain regions;

a gate insulating layer formed between said source and drain regions and between said isolation layers, a gate formed on said gate insulating layer, a program gate insulatively formed adjacent to said gate and coupled to a corresponding program line, and a control gate insulatively formed on said gate.

13. The memory device of claim 12, wherein a program gate is formed for each memory cell.

14. The memory device of claim 12, wherein a program gate is formed for two memory cells adjacent to each other.

15. The memory device of claim 12, wherein said program lines are formed over said word line, each being perpendicular to each other.

16. The memory device of claim 12, wherein said gate overlaps said isolation layer.

17. The memory device of claim 12, wherein said program gate is formed adjacent to said gate on a field insulating layer.

18. The memory device of claim 17, wherein said field insulating layer and isolation layer are alternately formed on the substrate.

19. The memory device of claim 12, wherein a programming operating of a selected memory cell is performed by transfer of charge carriers between said program gate and said floating gate.

20. The memory device of claim 19, wherein an erasure operation of the selected memory cell is performed by transfer of charge carriers from said floating gate to one of said source and drain regions.

21. The memory device of claim 19, wherein an erasure operation of the selected memory cell is performed by transfer of charge carriers from said floating gate to said program gate.

* * * * *